United States Patent [19]

Carter

[11] Patent Number: 4,544,317

[45] Date of Patent: Oct. 1, 1985

[54] VACUUM-TO-VACUUM ENTRY SYSTEM APPARATUS

[75] Inventor: Donald L. Carter, Vestal, N.Y.

[73] Assignee: International Business Machines Corporation, Armonk, N.Y.

[21] Appl. No.: 600,629

[22] Filed: Apr. 16, 1984

[51] Int. Cl.[4] .......................... F16C 32/06; F16J 15/40
[52] U.S. Cl. ........................ 414/217; 277/3; 384/121; 384/124; 384/134
[58] Field of Search ............... 414/217, 219, 220; 277/3; 384/111, 112, 121, 123, 124, 134

[56] References Cited

U.S. PATENT DOCUMENTS

| | | | |
|---|---|---|---|
| 2,695,198 | 11/1954 | Brugger | 384/109 |
| 2,814,512 | 11/1957 | Quinn et al. | 277/90 X |
| 3,260,383 | 7/1966 | Fitzgerald | 414/220 |
| 3,428,197 | 2/1969 | Fischer et al. | 414/217 |
| 3,733,490 | 5/1973 | Roche | 378/144 X |
| 3,833,018 | 9/1974 | Brooks | 414/220 X |
| 3,931,789 | 1/1976 | Kakei et al. | 414/219 X |
| 4,071,253 | 1/1978 | Heinen et al. | 277/3 |
| 4,118,042 | 10/1978 | Booth | 277/226 |
| 4,191,385 | 3/1980 | Fox et al. | 277/3 |
| 4,205,711 | 6/1980 | Lullini et al. | 277/3 X |
| 4,361,332 | 11/1982 | Logan et al. | 277/3 |
| 4,509,160 | 4/1985 | Eggers | 384/121 X |

Primary Examiner—Robert J. Spar
Assistant Examiner—Stuart J. Millman
Attorney, Agent, or Firm—Norman R. Bardales

[57] ABSTRACT

A vacuum-to-vacuum entry system which uses a rotary transport to transfer workpieces between two vacuum environments in a direction parallel to its axis of rotation and through the interface of a combination rotary gas bearing and seal. The combination gas bearing and seal seals off a zone in the gap between its two planar bearing surfaces that is radially offset from the axis of rotation of the bearing which is coincidental with the transport axis. Two arcuate gas sink channels on one of the bearing surfaces sink the gas of the bearing away from the zone. The bearing gas outside the zone in the gap and the two channels coact to effect a peripheral seal about the zone allowing the two vacuum environments when appropriately aligned to be in sealed communication with each other through the zone. A preferred embodiment is described for the transfer of ceramic substrates with circuitized surfaces between two vacuums environments.

18 Claims, 7 Drawing Figures

VACUUM-TO-VACUUM ENTRY SYSTEM APPARATUS

CROSS REFERENCE TO RELATED APPLICATIONS

In copending patent application, Ser. No. 600,630, concurrently filed herewith, and entitled "Combination Rotary Gas Bearing And Seal Apparatus", D. L. Carter, inventor herein, and assigned to the common assignee herein, there is described a combination rotary gas bearing and seal apparatus used in the apparatus of the present invention. The aforementioned copending application is incorporated herein by reference.

BACKGROUND OF THE INVENTION

1. Field of the Invention

This invention relates to entry system apparatus and more particularly to vacuum-to-vacuum entry system apparatus of the rotary type.

2. Description of the Prior Art

Entry systems and in particular vacuum entry systems of the rotary type are well known in the art, cf. for example, U.S. Pat. Nos. 3,260,383, 3,428,197, 3,833,018, and 3,931,789, to name just a few. Generally, a vacuum entry system is used in the placement of one or more workpieces into and/or out of an evacuated chamber as part of the fabrication or manufacturing process associated with the workpiece(s). During the passage of the workpiece(s), it is highly desirable that the integrity of the evacuated environment of the chamber be maintained.

For example, in the rotary type system of U.S. Pat. No. 3,260,383, this is accomplished by placing the workpiece in a recessed opening, which is at normal atmospheric pressure, of a rotatable member that is at a first angular position. The rotatable member is then rotated to a second position where the now workpiece loaded chamber is evacuated, i.e. depressurized, and next the member is rotated to a third position which aligns the now evacuated and workpiece loaded chamber with the opening of the main evacuated chamber in which the the workpiece is to be processed. Upon removal of the workpiece from the evacuated chamber of the rotating member into the main evacuated chamber, the member is then rotated back to the first position where the chamber is returned to normal atmospheric pressure and is ready to begin the next revolution and cycle with the next workpiece to be loaded therein. However, in this prior art system, mechanical seals in the form of rubber or plastic seal rings are used to seal off and isolate, the evacuated chamber of the rotating member, the main evacuated chamber, and the atmosphere with respect to one another. As a consequence, the friction created between the seals and the rotating member causes an increase in the torque requirements for the rotating member, as well as causing the seal interface to degrade and thus breakdown the seal between the evacuated chambers and/or atmosphere. Thus, this prior art system is not conducive to providing a vacuum entry system which is reliable and/or which has high throughput rates for processing the workpieces therein.

In U.S. Pat. No. 3,428,197, assigned to the common assignee herein, the rotary vacuum entry system thereof uses a pair of opposing flat plates, one of which is stationary and the other rotatable. The rotatable plate has three extended through openings that are equally radially and angularly spaced from the axis of rotation of the rotatable plate. Extended from the remote side of the rotatable plate are three article holding chambers each of which has a conformal opening which is in sealed and mounted abutment with one of the rotatable plate openings. The stationary member has an extended-through concentric arc-shaped slot through which the article in the holding chambers are passed into and out of the main evacuated chamber where the article is processed. The article is first loaded through another opening, i.e. the home opening, which is located on the remote side of the stationary member, this last mentioned opening being outside the main evacuated chamber and at atmospheric pressure. The home opening extends through the stationary member. In operation, the rotatable member is rotated to a position, i.e. the home position, that aligns one of its three openings with the home opening of the stationary member so that an article can pass through the aligned openings and into the article holding chamber. After the rotating member has been further rotated, it positions its particular opening associated with the now loaded article holding chamber with the aforementioned slot of the stationary member where it is passed from the article holding chamber into the main evacuated chamber for processing. Thereafter, the article is returned through the slot and back into the article handling chamber, and the rotatable member is rotated to the home position where the article is removed from the holding chamber through the aligned opening of the rotatable member and the home opening of the stationary member. An intermediate roughing pump stage position is provided between the home opening position and the workstation slot position. The system of U.S. Pat. No. 3,428,197 relies exclusively on the tight spacing between the opposing extremely flat surfaces of the members to prevent air leakage between the home, roughing and processing work stages. The stationary and rotatable members are maintained by a small separation of 0.00005 to 0.0010 inch by three equally spaced roller bearings that are mounted to and extend through the stationary plate so that their respective rollers contact the flat face of the rotatable member. As such, any eccentricity in one or more of the three bearings due to wear or variations in their manufacturing tolerances and/or variations in their vertical mounting positions and/or variations in the flatness of the plates will adversely affect the seal causing undesirable air leakage between the stages. Moreover, the system has additional torque requirements to overcome the rolling friction of the bearings against the rotatable member. As such, this prior art system is also not conducive to providing a vaccum entry system which is reliable and/or has high throughput rates for processing the workpieces therein.

The vacuum entry system of U.S. Pat. No. 3,833,018 is a rotary valve which uses a suction system to maintain a pressure differential in the clearance between the valve's cylindrical surface of the rotor and the compatibly contoured surface of the wall of the valve's rotor-receiving stationary chamber to control the air leakage between the high pressure side of the valve and its low pressure side. The actual clearance, however, is maintained independently by the mechanical supports that support the rotor or the shaft to which it is affixed. Thus, in this prior art system there is no way to compensate for variations in the concentricities of the rotor and/or curved chamber wall due to eccentricities in the rotor and/or wall and/or non-concentric alignment of the center axis of the chamber and that of the rotor. As a result, the system is conducive to degradation of the control of the air leakage making it unreliable and/or amenable to having a slow throughput rate. Moreover, because the control uses curved surfaces and the separation therebetween for its operation, the workpiece must pass through the rotor in a radial direction through an elongated slit or bore in the rotor. The slit lies in a predetermined diametral plane of the cylindrical rotor and is coincident with the axis of rotation. The article thus when passing through the slit is in a direction normal to and including the axis of rotation. As such, this prior art system cannot be used to process articles through a rotating member in a direction parallel to the axis of rotation, and/or offset from the axis of rotation, and is hence is not conducive to processing the articles at a high throughput rate.

The vacuum entry system of U.S. Pat. No. 3,931,789 uses sliding gate valves to enter and exit the articles thereof into the various vacuum chambers thereof. However, these type of prior art entry systems are also unsatisfactory. More particularly, during the periods that the value door is open, leakage occurs which compromises the integrity of the vacuum and/or increases the time to process the article because of the time needed to restore the integrity of the compromised vacuum. Moreover, slide valves have characteristically slow response times. Thus, the entry system of U.S. Pat. No. 3,931,789 is not reliable and/or isn't very conducive to high throughput because of its slow response time associated with such type valves and/or the aforementioned leakage and/or time needed to restore the integrity of the compromised vacuum.

In a non-vacuum entry system of the prior art, cf. U.S. Pat. No. 4,205,711, the automatic filling machine thereof, which is used for the dosing of powder from a hopper through an intermediate sector body to a rotatable dosing head, compressed air is used in the spacing between the concentric curved surfaces of the dosing drum head and the sector body to provide a hermetic seal for the opening of the body and the underlying powder carrying chambers of the rotating drum head. The hermetic seal provided by the compressed gas is only operative when the head is rotating, and, moreover, only during the rotation is the hermetic seal intended to prevent the powder from the opening of the body from entering the opening of the carrying chamber. During the rotational movement periods of the drum head, the sector body is in a retracted outward radial position with respect to the rotating head and is maintained at a spacing with respect to the head by a set of locator pins. During the periods of non-rotation of the head, the sector body is an extended radially inward position that places the body in contact with the head via another set of locator pins. The compressed gas is and must not be present during these last mentioned periods so as to allow the transfer, which is also in the radial direction, of the powder from the opening of the body to the aligned opening of one of the plural powder carrying chambers by suction means, which gas if otherwise present would prevent the transfer as explained previously. Thus, even though the compressed gas may also provide some lubrication between the moving parts, it is and can only be present during the actual rotation periods. Because of the intermittent presence of the gas and/or because of the requirement of curved surfaces for the sealing and/or lubrication operation, this prior art system is only useful for passing the powder through the aligned openings in a radial direction. In addition, the spacing between the two surfaces are maintained exclusively by independent mechanical means. Due to variations in the concentricity of the respective surfaces such as, for example, misalignment with respect to the axis of rotation, the seal is subject to leakage. Thus, this prior art entry system is not very reliable and/or has poor throughput rates. It is particularly not conducive for vacuum to vacuum entry systems and/or particularly for vacuum to vacuum entry systems of the rotary type in which the article passes through in a direction parallel to the axis and/or where the seal is required to be present as the transferring of the article from one vacuum to the other vacuum is taking place.

Moreover, as discussed in my aforementioned copending application, combination rotary gas bearing and sealing devices are well known in the art, cf. for example, U.S. Pat. Nos. 2,814,512, 3,733,490, 4,118,042, 4,191,385, and 4,361,332, to name just a few. In general, in such devices the gas of the bearing is used to effect the seal. However, heretofore in the prior art of which I am aware, the seal could only seal off a region of the bearing which encompassed the axis of rotation of the bearing, the seal and region being generally concentric with the axis. Thus, the prior art devices were not amenable to system apparatus in which there is a need to provide a seal for a region between two planar gas bearing surfaces of the bearing that is offset from the axis of rotation, i.e. a region which is radially offset from and doesn't include the axis of rotation. Hence, the prior art devices were not amenable to providing a seal for a low pressure region and especially a vacuumized opening in a rotary gas bearing using air or the like where the region has to be radially offset from and not encompass the bearing's axis of rotation.

In summary, none of the prior art of which I am aware contemplates a vacuum-to-vacuum entry system in combination with a combination rotary gas bearing and sealing device in the manner and according to the principles of the present invention as described herein.

SUMMARY OF THE INVENTION

It is an object of this invention to provide vacuum-to-vacuum entry system apparatus of the rotary type which passes one or more workpieces in a direction parallel to the axis of rotation.

It is another object of this invention to provide vacuum-to-vacuum entry system apparatus of the rotary type of the aforementioned kind in combination with a rotary gas bearing and seal apparatus, in which the workpiece(s) are passed through a zone in the gap of the rotary gas bearing and seal that is sealed off by the gas of the bearing, and the zone is radially offset from the bearing's axis of rotation and doesn't include the axis of rotation.

It is still another object of this invention to provide vacuum-to-vacuum entry system apparatus of the aforementioned kind which is highly reliable and/or has a high throughout rate.

Still another object of this invention to provide vaccum-to-vacuum entry system apparatus of the aforementioned kind for the passage of circuitized substrates from one vacuumized chamber to another without substantially compromising the integrity of the vacuum.

According to one aspect of the present invention, there is provided a vacuum-to-vacuum entry system and 5 formed in another surface 1B of member 1, and the two series of plural holes 40 and 50, cf. FIG. 6. The series of holes 40 extend through member 1 to surface 1A and are radially and angularly symmetrically disposed on the surface 1A in an inner circle that is in circumferential alignment and registration with the circular channel 4 on surface 1B. Similarly, the series of holes 50 extend through member 1 to surface 1A and thereat are radially and angularly symmetrically disposed in an outer circle that is in circumferential alignment and registration with the circular channel 5 on surface 1B. Thus, as shown, holes 40 and 50 intersect channels 4 and 5, respectively, in a direction normal to surface 1A, as well as the surface 1B for the disc configuration of member 1 of the preferred embodiment. By way of example, the number of holes in the two series of holes 40 and 50 are six and eighteen, respectively, as shown in FIG. 3.

The member 1 also includes a cover 6, FIGS. 2, 4–5, which is mounted via suitable means, e.g. screws, not shown for sake of clarity, to the surface 1B and sealed thereto by a gasket, not shown, or the like. Affixed to the cover 6 and in respective alignment with the channels 4 and 5 are two interconnected appropriate valve connections or fittings 41 and 42 which together with the partially shown flexible tubing 43, FIG. 2, and a connected-thereto appropriate gas supply, not shown for sake of clarity, are part of the aforementioned gas supply means. The channels 4 and 5, as a result of being enclosed by cover 6 provide respective intake manifold connections for the gas from fittings 41 and 42, respectively, to the respective holes 40 and 50. The gas upon exiting from the holes 40 and 50 at the surface 1A reacts with the surfaces 1A and 2A in a thrust bearing manner to axially support the members 1 and 2, and thereby providing and/or maintaining a predetermined small size gap or spacing S, FIGS. 4–5, between the surfaces 1A and 2A both for the static and dynamic operational modes of the members 1 and 2.

In a given sector of the surface 1A relative to the axis 3, there is a region which is offset radially from and is not intersected by the axis 3 and which is desired to be sealed off. The offset region, as described in greater detail in my aforementioned copending application and somewhat in similar detail hereinafter, is sealed by coaction of the gas between the two surfaces 1A and 2A and gas sink means, and more particularly, the gas sink means is disposed within the aforementioned sector to sink away the gas from the region whilst the remaining gas within the sector seals off the region as will be next described.

The gas sink means preferably has two gas sink parallel arcuate channels 7 and 8, cf. FIG. 3, which are preferably disposed in the gas bearing surface 1A of member 1 in a concentric manner about the axis 3 and hence are also concentric with the circularly disposed holes 40 and 50 and their associated circular channels 4 and 5 on surface 1B. Channels 7 and 8 lie in a predetermined sector of surface 1A. In the preferred embodiment, the sector has 180 degrees and corresponds to the upper half of the surface 1A as viewed facing FIG. 3. The arcuate channels 7 and 8 are disposed on surface 1A at respective radial distances which are between those of the inner and outer circular channels 4 and 5 on surface 1B, and the channels 7 and 8 extend the arc length of the given sector, which in the preferred embodiment is 180 degrees, as aforementioned. Each of the channels 7 and 8 is intersected by a series of plural holes, i.e. holes 70 and 80, respectively. By way of example, the number of holes 70 and 80 are two and four, respectively, as shown in FIG. 3. In the preferred embodiment, the holes 70 are symmetrically disposed on the arc of the channel 7, and likewise the holes 80 are symmetrically disposed on the arc of the channel 8.

The two series of holes 70 and 80 extend from the gas bearing surface 1A through to the opposite surface 1B of member 1 and intersect arcuate channels 7B and 8B, respectively, disposed on surface 1B, cf. FIG. 6. Channels 7B and 8B are concentric with axis 3 and in corresponding alignment and registration with the respective channels 7 and 8 that are on the gas bearing surface 1A. The two arcuate channels 7B and 8B of surface 1B are connected, in turn, by the interconnected fittings 71 and 72, respectively, mounted on cover 6, cf. FIG. 2. Fittings 71 and 72 in turn are connected via flexible tubing 73 to a roughing pump 110, FIG. 1, in a manner well known to those skilled in the art. The aforementioned two arcuate channels 7B, 8B, fittings 71, 72, tubing 73, and roughing pump 110 are part of the gas sink means.

The two arcuate channels 7B, 8B of surface 1B as a result of being enclosed by cover 6 provide exhaust manifold connections for the gas being sinked through the arcuate channels 7 and 8 of surface 1A and into the respective holes 70 and 80, the two channels 7B and 8B then passing the gas onto the roughing pump 110 via the associated fittings 71, 72 and tubing 73 in a manner well known to those skilled in the art. As a result, in the region of surface 1A that is between the channels 7 and 8 in the aforementioned upper half circle sector of the surface 1A as viewed facing FIG. 3 and which is at a mean radial distance R from axis 3, the gas is sinked away from the region by the gas sink means through its channels 7 and 8, and the region is effectively sealed off by the coaction of the gas outside the region and the gas sink means.

In operation, the gas which exits from the holes 40 and 50 cause a thrust bearing like reaction between the surfaces 1A and 2A which keeps them separated by a small size gap or spacing S. Moreover, a zone is established as a portion of the gap S, which zone is substantially adjacent to and conformal with the region on surface 1A between the gas sink channels 7 and 8. The zone extends through the gap S from surface 1A to the surface 2A. The gas is prevented from entering the zone due to the coaction of the gas sink channels 7 and 8 and the small size of the spacing S. Thus, the aforementioned portion or zone of the gap S, which zone also is radially offset from and is not intersected or include the axis 3, is effectively surrounded or encompassed by the remaining gas in the gap S and thereby is provided with a peripheral seal around the zone with the gas which is outside the aforesaid zone. Moreover, the seal is present for both the static and dynamic operational conditions or modes of the members 1 and 2, that is to say, when the member 2 is not and is, respectively, rotating relative to member 1 about axis 3.

An opening 9, FIGS. 3–6, is provided in member 1 in the aforementioned sealed off region. The opening 9, which extends through member 1 from surface 1A to surface 1B and through its cover 6, is preferably symmetrically located in the region. At the cover 6, the opening 9 is adapted to be connected, in a manner well known to those skilled in the art, to the vacuumized environment of the staging chamber 108 through an appropriate seal connection, i.e. the hollow bellows-like connection 90, cf. FIGS. 2, 4–5. The chamber 108 has apparatus with at least two first and second vacuumized chambers. The apparatus has first member means with a first planar gas bearing surface and a first another surface. A first opening extends through the first member means between the two aforesaid first surfaces and is in a predetermined sealed communication with the interior of the first chamber. The first chamber is disposed adjacent the aforementioned first another surface. The apparatus also has second member means having a second planar gas bearing surface in parallel facing relationship with the first gas planar surface. The second member means also has a second another surface. Means are provided for relative rotation between the first and second gas bearing surfaces about a predetermined axis. The axis is normal to the planar first and second gas bearing surfaces. A second opening extends through the second member means between its two aforementioned second surfaces. The second chamber is disposed adjacent the aforementioned second another surface. The second opening is likewise in a predetermined sealed communication with the interior of the second chamber. The first gas bearing surface has a predetermined region therein offset a predetermined radial distance from the axis and is not intersected by the axis. The first opening at the first gas bearing surface is disposed within the region. Gas supply means provides a gas between the first and second gas bearing surfaces that axially supports the first and second member means with a predetermined spacing between the first and second gas bearing surfaces. Gas sink means are provided within a predetermined sector of the first gas bearing surface relative to the axis. The region is disposed within this sector, and the gas is sinked away from the region by the gas sink means. The gas between the first and second gas bearing surfaces and the gas sink means coact to provide a seal for the region and for a zone of the spacing, which zone extends through the spacing from the region to the plane of the second planar gas bearing surface. The first and second gas bearing surfaces are angularly positionable about said axis by the rotation means so as to place the first and second openings at the first and second gas bearing surfaces, respectively, in facing alignment with respect to each other and the sealed zone to effect a sealed communication between the two vacuumized chambers.

The foregoing and other objects, features and advantages of the invention will be apparent from the more particular description of the preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENT

For sake of explanation and/or simplicity, in the figures of the present application and of my aforementioned copending application, like elements are designated with similar reference numbers.

Figure 1:
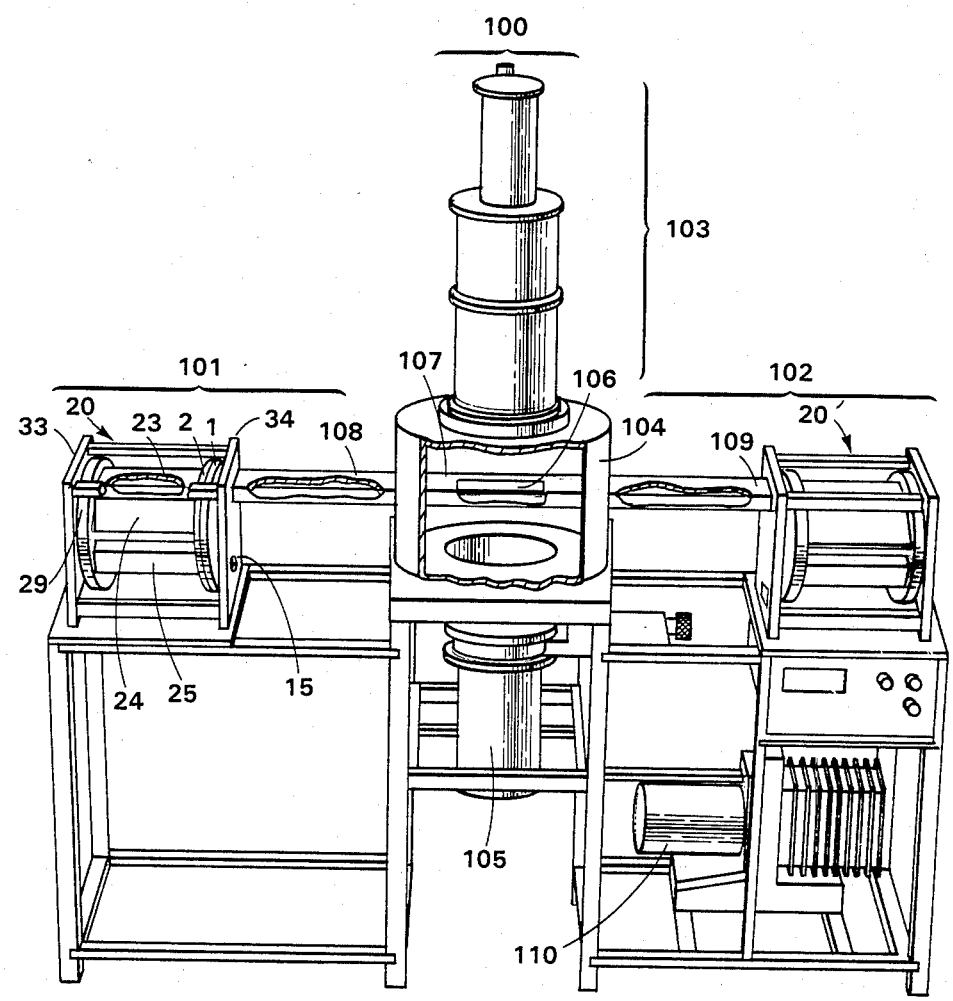
FIG. 1 is a perspective schematic view, partially shown in cross section, of preferred embodiments of the vacuum-to-vacuum entry system apparatus of the present invention in conjunction with its use in the testing of circuitized ceramic substrates by an electron beam open and short circuit tester.

Referring to FIG. 1, there is shown an electron beam tester, generally indicated by the reference numeral 100 and input and output vacuum entry system apparatuses, generally indicated by the reference numerals 101 and 102, respectively, which are preferred embodiments of the present invention. The upper end of the tester 100 includes the chamber 103 which houses the electron beam gun and its associated accessories. The beam projects into a lower chamber 104 in which the circuitized ceramic substrates are tested by the beam as hereinafter explained. A pump 105 is connected to the lower chamber 104 and is used to evacuate the chambers 103–104. The beam is projected through the opening 106 located in the top of the hollow rectangular cross sectioned channel or tube 107. The open ends of channel 107 are each connected in a sealed abutment to one of the open ends of one of the feed-in and feed-out staging chambers 108 and 109, respectively, that are diametrically mounted to the cylindrical wall of chamber 104. It should be understood that the chambers 108 and 109 extend through openings, not shown, provided in the wall of chamber 104 in a sealed manner as is well known to those skilled in the art. Hence, chambers 108 and 109 are also evacuated by the pump 105. The other open ends of staging chambers 108 and 109 are connected to respective assemblies 20 and 20' of apparatuses 101 and 102, respectively.

The vacuum entry system apparatus 101 will now be described with reference to FIGS. 2–6. It includes an assembly 20 with a cylinder-like configuration. The assembly 20 in accordance with the principles of the present invention has a combination gas bearing and seal apparatus that is described in my aforementioned copending application. More particularly, the combination gas bearing and seal apparatus has two members 1 and 2 with respective planar gas bearing surfaces 1A and 2A, cf. FIG. 3. The gas bearing surfaces 1A and 2A are in parallel facing relationship. The two surfaces 1A and 2A are relatively rotatable about an axis 3 that is normal to the surfaces 1A and 2A. Preferably, the member 1 is stationary and the member 2 is incrementally rotatable about axis 3 in a manner well known to those skilled in the art. Moreover, members 1 and 2 preferably have compatible cylindrical shapes, e.g. disc shapes, and members 1 and 2, and hence are their circular surfaces 1A and 2A, concentrically aligned with the axis 3.

Figure 2:
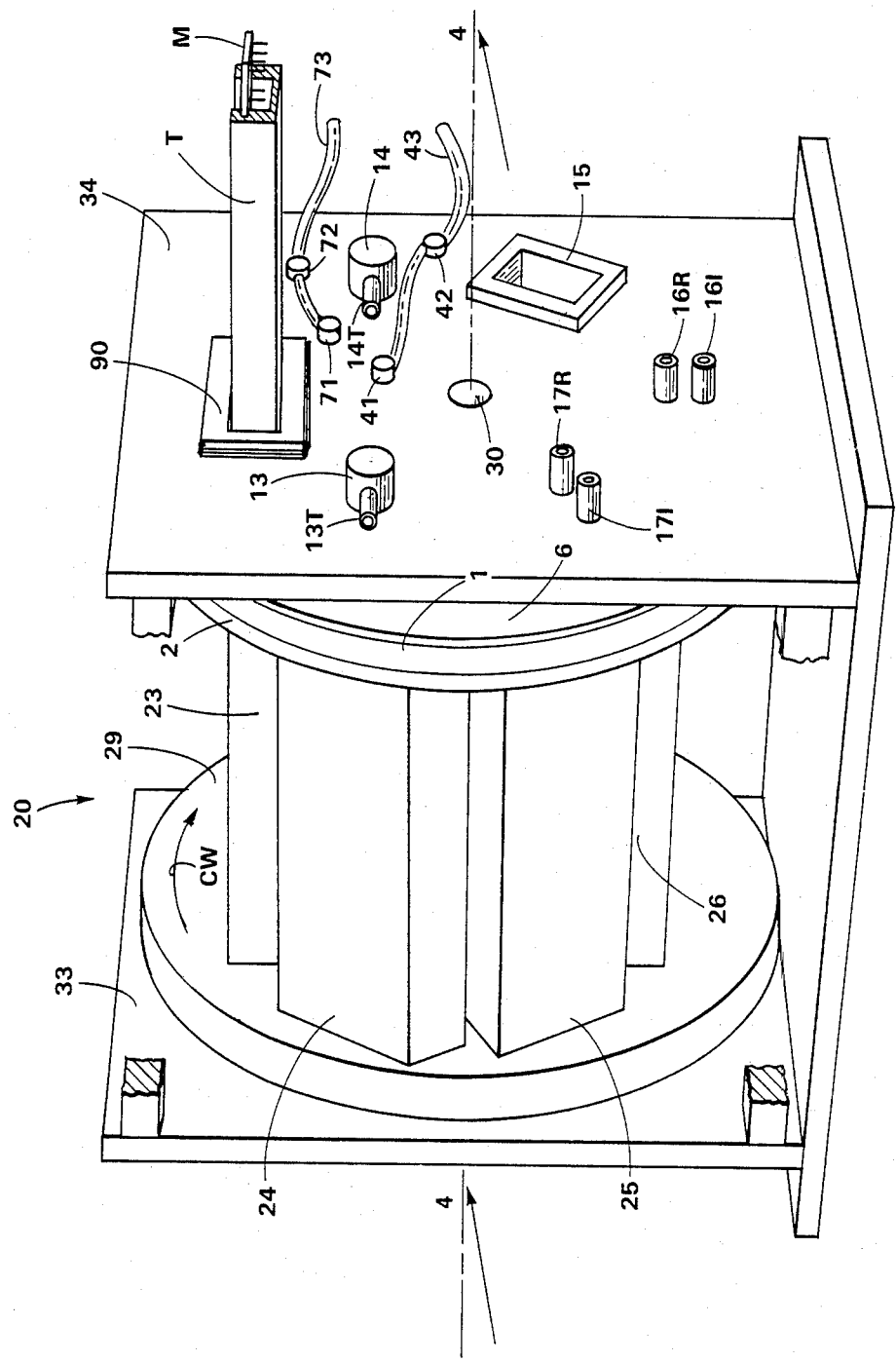
FIG. 2 is an enlarged perspective view of the preferred embodiment of the vacuum-to-vacuum entry system apparatus of FIG. 1.

The gas for the bearing is supplied by gas supply means that includes two concentric circular channels 4 tings 13 and 14, respectively, FIG. 2. Fitting 13 is connected through flexible tubing 13T to a roughing pump system, which may use the same pump 110 or another independent one. Fitting 14, on the other hand, is connected through another flexible tube 14T to a gas supply system, which is also air or alternatively nitrogen as the case may be in the preferred embodiment. The aforementioned peripheral seal around the aforementioned sealed region and adjacent zone in the gap S also provides a peripheral seal for the openings 11 and 12.

Figure 3:
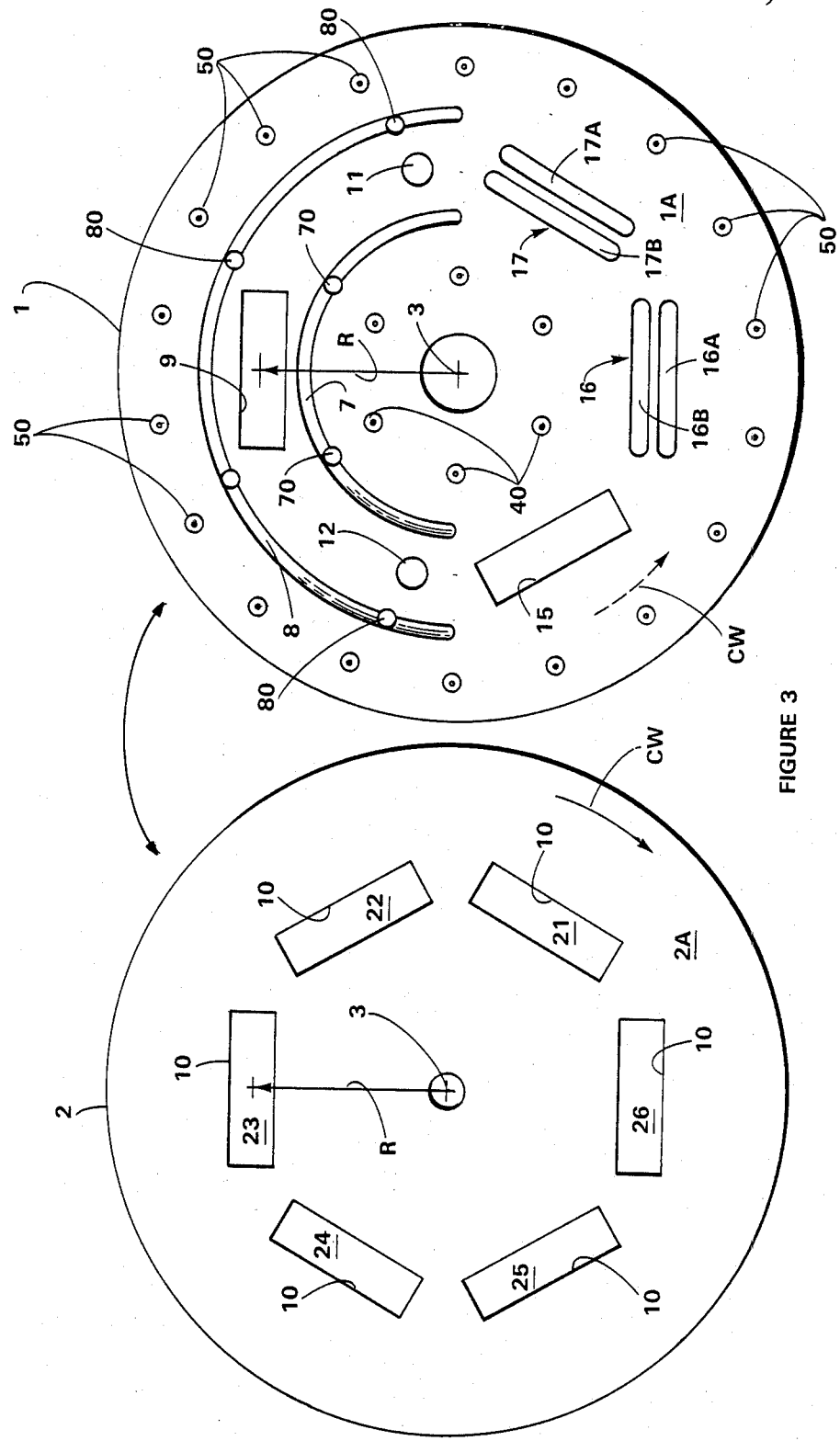
FIG. 3 is an enlarged exploded view of the respective opposing bearing surfaces of the combination gas bearing and seal apparatus described in my aforementioned copending application and which is used in combination with the apparatus of the present invention shown in FIG. 2.

In addition, member 1 in its lower half sector of surface 1A as viewed facing FIG. 3 has an opening 15 with a cross sectional configuration compatible with those of openings 9 and 10, which in the preferred embodiment is rectangular. Opening 15 extends through member 1 and its cover 6. Opening 15 provides access to the chambers 21-26, as hereinafter explained. Also provided in the member 1 are two sets, designated generally by the reference numbers 16 and 17, of paired parallel aligned slitlike openings 16A-16B and 17A-17B, respectively, which also extend through member 1 and cover 6. Sets 16 and 17 are associated with the cleaning and drying preparatory processes, respectively, used prior to testing, and which are hereinafter described. It should be understood that the member 34 is provided with appropriately aligned conformal openings to provide extension and passage therefrom and/or access thereto of the particular fittings 13, 14, 41, 42, 71, 72 and 90, and 16I, 16R, 17I and 17R, hereinafter described, associated-with and/or the various openings 9, 11, 12, 15, 16, 17 and manifolds 4, 5, 7B and 8B of openings 40, 50, 70 and 80, respectively. Openings 15, 16, 17, 11 and 9 and 12 of member 1, and in the particular sequence as just mentioned, correspond to the six workstations associated with the assembly 20 to which each opening 10 of member 2 is sequentially incremented as is explained in greater detail hereinafter. For sake of clarity, the details of the openings of member 34 and the fittings extended therethrough and/or associated tubing are omitted in FIG. 1.

The assembly 20 of the preferred embodiment acts as a rotary transport and is used to load ceramic substrates having high density circuit line surfaces into the vacuum chamber 104 of the electron beam open and short circuit tester 100, whose principle of operation is well known to those skilled in the art. Briefly, by way of explanation, the electron beam under controlled and known operating parameters is addressed to and charges the adjacent circuit line(s) of a circuit line under test. By observing and/or comparing the results with predetermined expected conditions for the given parameters, a determination can be made if the line under test is good or if it is defective vis-a-vis a short circuit condition. To test for an open circuit condition, the electron beam, again under controlled and known operating parameters, is addressed to one end of the circuit line under test and charges the particular line addressed. By observing and/or comparing the results at another end of the particular line under test with predetermined expected conditions for the given parameters, a determination can be made if the line under test is good or if it is defective because of an open circuit condition.

In operation, the member 2 is incrementally rotated during a dynamic operational mode interval which rotates surface 2A in the clockwise direction as viewed facing FIG. 3 and designated by the arrow CW in the drawing, so that an opening 10 thereof is placed in alignment with the opening 15 of member 1 at which point the motion is stopped thereby commencing a static operational mode interval. As a result, one of the empty chambers 21-26, which for purposes of explanation is assumed to be chamber 21, is placed in alignment with the opening 15 of member 1. As such, chamber 21 during this static operational mode interval is in operative position with the first work station of the assembly 20 associated with the opening 15 which is at normal atmospheric pressure (760 Torr). Next, an open cartridge or tray T carrying a row of aligned and abutting planar high density circuitized ceramic substrates M, which may be pinned or not pinned, with their circuitized surfaces MA, FIG. 5, coplanarly aligned in the tray T and facing outwardly with respect to the cylinder assembly 20 is fed into chamber 21 through opening 15 and the aligned opening 10 of the chamber 21. It should be understood and noted that under these conditions the other chambers 22 to 26 are concurrently in operative positions with the sixth, fifth, fourth, third and second work stations, respectively, of assembly 20 which are associated with the openings 12, 9, 11, 17A-17B and 16A-16B, respectively. Thereafter, after each incremental rotation, each of the chambers 21 to 26 is operatively positioned with the next work station of the sequence.

Figure 7:
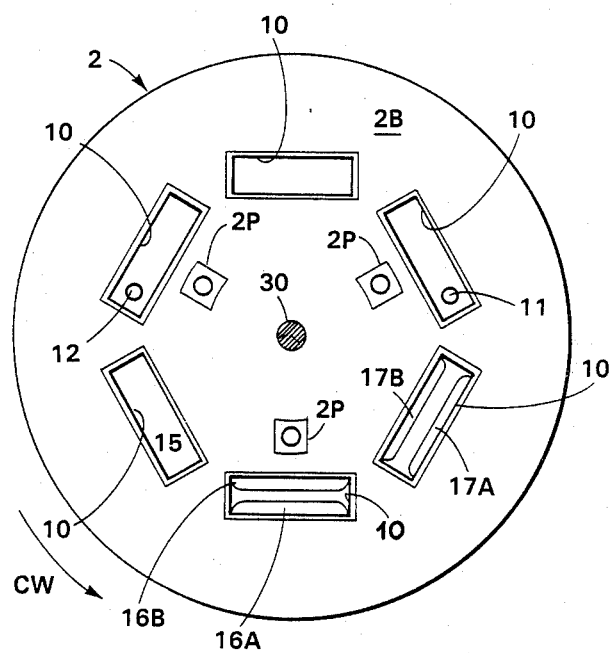

More particularly, by way of explanation and for sake of clarity, during a static operational mode interval, each of the six openings 10 of member 2 are aligned with respect to one of the openings 9, 11, 12, 15, 16A-16B and 17A-17B of member 1 as shown in FIG. 7 as viewed facing surface 2B. Thus, each of the chambers 21 to 26 associated with one of the openings 10 is in a concurrent operative position with one of the six work stations associated with the openings 9, 11, 12, 15, 16A-16B, and 17A-17B. It should be understood that the static and dynamic operational modes occur in alternate time intervals, and that each dynamic operational mode interval concurrently advances, i.e. rotates, each of the chambers 21-26 to the next workstation of the sequence.

Accordingly, for the given assumption, the next clockwise incremental rotation, places chamber 21 in alignment with the set 16 of openings 16A and 16B, and the next chamber 22 in alignment with opening 15. Chamber 21 is now in operative position with the second work station of assembly 20. Through an appropriate sealed fitting 16I, FIG. 2, a cleaning fluid is injected through opening 16A across the gap S and into the aligned opening 10 associated with chamber 21. From there, the fluid flows across the circuitized surfaces MA of the substrates M. It should be understood that the tray T when loaded in the chamber 21 positions the row of abutted modules M carried thereby so that their respective abutted coplanar circuitized surfaces MA are in an alignment with the slit 16A that allows the fluid to be injected across the coplanar circuitized surfaces MA. The curved inner surface of end 28 of chamber 21 reverses the flow direction of the cleaning fluid and returns it along the opposite surfaces, which are also coplanarly aligned and in abutment, of the substrates M and back towards opening 10 from where it passes through the gap S and into slit 16B and from there is exhausted through an appropriate sealed fitting 16R, FIG. 2. Again, it should be understood that the tray T when loaded in the chamber 21 positions the row of abutted modules M carried thereby so that their respective abutted coplanar last mentioned opposite surfaces are in an alignment with the slit 16B that allows the fluid an opening which corresponds to and is conformal with the opening 9 and which is in sealed abutment with the opening 9 to which it is mated and connected through the fitting 90. As such, the opening 9 is also vacuumized. The opening 9, and hence also the vacuum chamber 108 connected thereto, is sealed off in the spacing S by virtue of the location of opening 9 in the aforedescribed region between the two channels 7 and 8.

Moreover, in accordance with another aspect of the present invention, the other member 2 is also provided with at least one or more openings 10 that extend through member 2 from its surface 2A to another surface 2B. Thus, as shown in FIG. 3, member 2 has six preferably identical openings 10, which are angularly and radially disposed in a symmetrical manner in a circle that is concentric with axis 3. These openings 10 have substantially identical configurations as opening 9 of member 1. The respective centers of opening 9 and each opening 10 are located substantially at the same radial distance R from axis 3. Consequently, as each opening 10 is brought into alignment with the opening 9, as the surface 2A is incrementally rotated about axis 3, it is placed in communication with the opening 9 through the aforedescribed sealed zone in the gap S. Moreover, in the particular embodiment, as a result of an opening 10 being moved into a position where it is aligned with the upper half sector of surface 1A, it is in substantially facing relationship with the sealed off aforementioned region between the two arcuate channels 7 and 8. As such, the coaction of the gas in the spacing S between the surfaces 1A and 2A and of the the gas sink means associated with the gas sink manifold channels 7 and 8 provide a peripheral seal around the region and aforedescribed zone and thus likewise seals the particular opening 10 of member 2, as well as the opening 9 of member 1. Hence, as the two openings 9 and 10 are placed in communication with each other through the aforedescribed zone of the gap S as they move into and out of overlapping and concentric facing alignments, the gas outside the aforedescribed zone thereby provides a peripheral seal for the intercommunicating openings 9 and 10 when so aligned.

Figure 4:
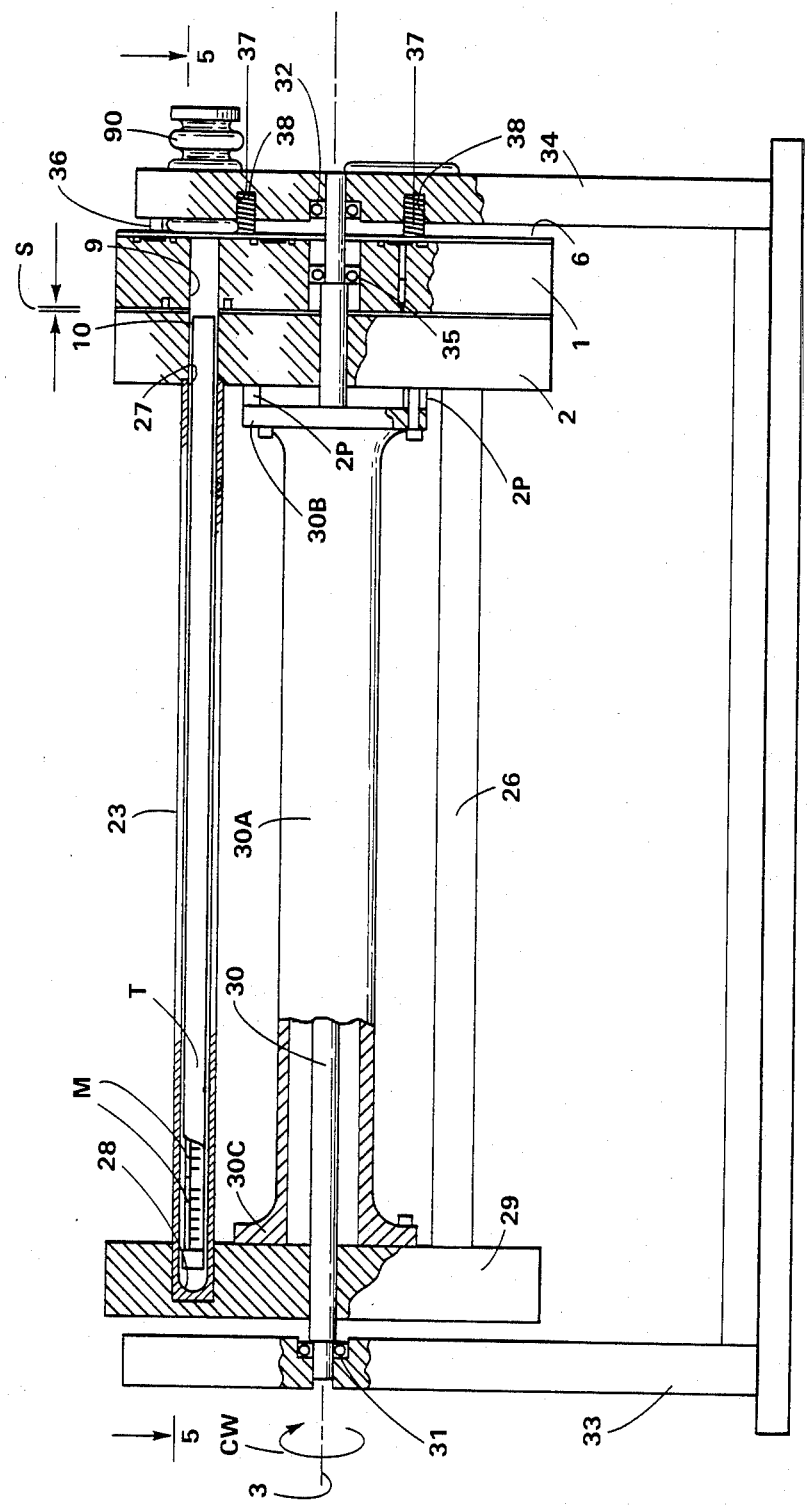
FIG. 4 is a schematic partial side view, partially shown in cross section, of the vacuum-to-vacuum entry system apparatus of FIG. 2 taken along the line 4—4 thereof.
Figure 5:
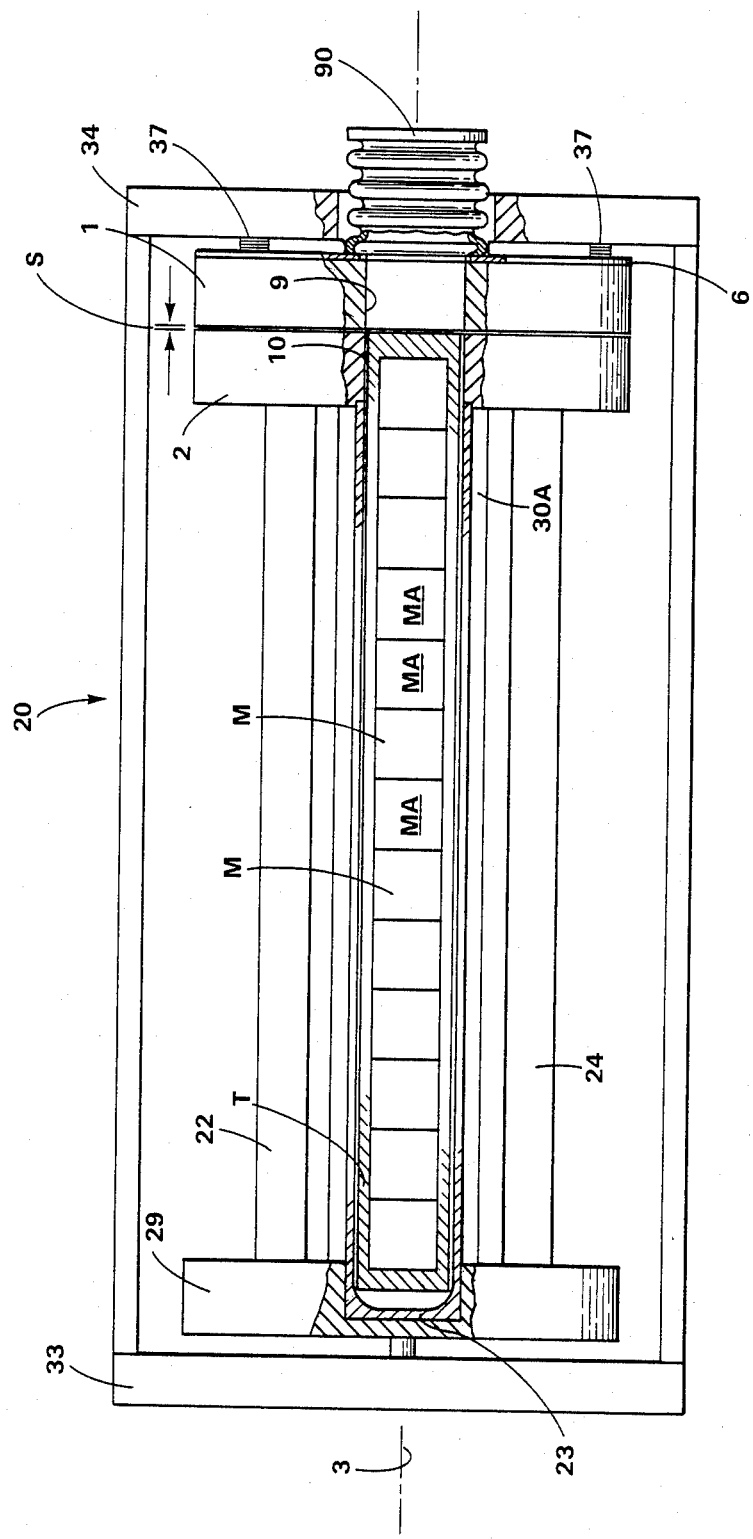
FIG. 5 is a schematic partial top view, partially shown in cross section, of the vacuum-to-vacuum entry system apparatus of FIG. 4 taken along the line 5—5 thereof.
Figure 6:
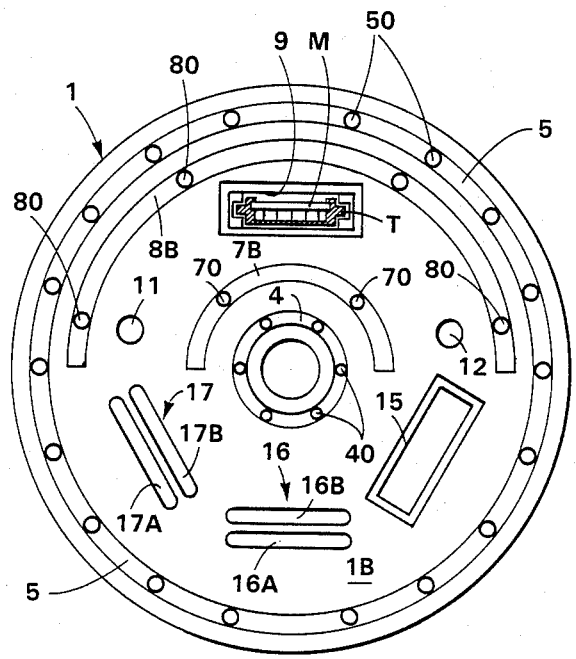
FIGS. 6 and 7 are reduced views of the opposite surfaces of the stationary and rotating members, respectively, of FIG. 3.

In the vacuum-to-vacuum entry system of the present invention, the openings 10 are connected to individual carrier or loading chambers. Hence, for the particular number of openings 10, to wit: six, there are a corresponding number of six identical loading chambers, which for sake of clarity are numbered in a counterclockwise direction as seen through the openings 10 from the surface 2A, i.e. facing FIG. 3, by the reference numbers 21-26. Each chamber 21-26 is an elongated hollow member with a rectangular cross section. One end 27 of the chamber, cf. FIG. 4, is open ended and has thereat a compatible opening which is in sealed abutment-with and mated-to one of the openings 10 at the surface 2B of member 2 to which the end 27 of the particular chamber is also supportably mounted. The six chambers 21-26 are mounted in the cylindrical shaped assembly 20 in a squirrel cage like manner. More particularly, the chambers 21-26 are supported at their opposite closed ends 28 in a circumferential manner to a disc shaped member 29.

Members 2 and 29 are affixed to a rotatable shaft 30, FIG. 4, which is coincident with axis 3 and is also not encompassed by the sealed-off aforementioned offset zone and region between channels 7 and 8. Shaft 30 is journaled by mechanical bearings 31 and 32 in two support frame members 33 and 34, respectively.

In the preferred embodiment of the present invention, member 1 is also preferably supported on shaft 30 by a mechanical bearing 35, cf. FIG. 4. Shaft 30 is free to rotate in the bearing 35, the member 1 being prevented from rotating on the shaft 30 by an appropriate pin stop 36 which is affixed to frame member 34 and extends outwardly therefrom towards member 1 and received in a sealed opening, not shown, thereof that extends through cover 6 and inwardly from surface 1B partially into member 1. The member 1 is urged towards member 2 by plural, e.g. six, springs 37, FIG. 4, which are radially and angularly symmetrically disposed with respect to axis 3 and are mounted in openings 38 in member 34 and extend outwardly therefrom with their free ends contacting the outer surface of cover 6. For sake of clarity, only two of the springs 37 and their associated openings 38 are shown in FIG. 4.

Preferably, the surfaces 1A and 2A are high precision polished, i.e. lapped, surfaces. The springs 37 bias the surfaces 1A and 2A in their respective parallel relationship. However, any slight deviation from this relationship is compensated by the resulting reaction of the gas of the gas bearing on the surface 1A which overcomes the spring bias of the appropriate one or ones of the springs 37 and allows the member 1 to pivot slightly on the bearing 35 in a direction which substantially returns the surfaces 1A and 2A to their desired parallel orientation. A slight clearance is provided in the aforementioned opening, not shown, of member 1 which receives stop 36 to allow the slight pivot motion of member 1 on bearing 35. It should be noted that the bellows action of the connection 90 between the member 1 and the relatively fixed aforementioned stagging chamber, not shown, allows the slight axial and pivotable motion of member 1 on shaft 30 to take place.

Shaft 30 is driven in an intermittent manner by an incrementable drive system, not shown, such as, for example, a rotary stepper motor driver system or the like. Thus, as the shaft 30 is incremented, it rotatably increments the member 2 and hence the surface 2A relative to the stationary surface 1A about axis 3. In the preferred embodiment, the shaft 30 and hence member 2 and its surface 2A are incremented in six equal radial positions corresponding to and in alignment with the six work stations, hereinafter described, which are associated with the assembly 20.

It should be understood, for the periods during which the member 2 is being rotated, the apparatus is in its dynamic operational mode; and for the periods during which the member 2 is stationary, the apparatus is in its static mode. In either case, the gas is present in the gap S and is providing the combination bearing and seal function as previously explained. In the preferred embodiment of the present invention, air or alternatively nitrogen is preferably used as the gas for the bearing. A hollow rigid shaft 30A, FIG. 4, which is concentric with shaft 30 provides additional support for the assembly 20. Shaft 30A has a flanged end 30B which is affixed to the mounting pedestals 2P integrally formed on the surface 2B of member 2. The other flanged end 30C is affixed to member 29.

In the particular vacuum-to-vacuum entry system apparatus being described, preferably the member 1 is also provided with two circular openings 11 and 12 in the sealed region between channels 7 and 8 on opposite sides of opening 9 as viewed facing FIG. 3. Openings 11 and 12 extend from surface 1A through to surface 1B and through cover 6 where they are connected to fitto be returned therealong and exhausted at slit 16B. Moreover, as a result of the abutting coplanar circuitized and/or abutting coplanar opposite surfaces of the modules M, the row of abutting modules M act as a baffle for the cleaning fluid as it flows first from end 27 to end 28 of the chamber 21 and then is returned back to the end 27 as previously described. Concurrently, another tray T of substrates is loaded through opening 15 into the next chamber 22.

As a result of the next incremental rotation of member 2, chamber 21 is placed in alignment with the set 17 of openings 17A and 17B of the third work station, chamber 22 is placed in alignment with the set 16 of openings 16A and 16B of the second work station, and the next chamber 23 is placed in alignment with the opening 15 of the first work station. A drying gas is injected through an appropriate sealed fitting 17I, FIG. 2, that is connected to opening 17A, and passes through the gap S into the aligned opening 10, and from there into the open end 27 of chamber 21 where the drying gas then flows across the circuitized surfaces MA of the substrates M, which are also in alignment with the slit 17A for the reasons previously explained with respect to their alignment with slit 16A. The drying gas flows from end 27 to end 28 of chamber 21 whereupon it reverses its flow direction and returns along the opposite surfaces of the substrates M back to end 27 and opening 10 from where it passes through gap S into slit 17B and from there is exhausted through an appropriate fitting 17R, FIG. 2, that is connected to slit 17B. The last mentioned surfaces of the modules M in the tray T are in alignment with slit 17B, which last mentioned surfaces are also in alignment with the slit 17B for the reasons previously explained with respect to their alignment with slit 16B. Moreover, as a result of the abutting coplanar circuitized and/or abutting coplanar opposite surfaces of the modules M, the row of abutting modules M also act as a baffle for the drying gas as it it flows first from end 27 to the end 28 of the chamber 21 and then is returned back to the end 27 as previously described. Concurrently, the tray T of substrates M in chamber 22 which is aligned with the set 16 of openings 16A–16B of the second work station is cleaned with the cleaning fluid, and another tray T of substrates M is loaded through opening 15 of the first work station into the next chamber 23.

On the next incremental rotation of member 2, chamber 21 is placed in the aforedescribed region between channels 7 and 8 which is sealed off by the bearing gas, which as aforementioned is air or alternatively nitrogen as the case may be in the preferred embodiment, of the aforedescribed gas bearing. As a result, chamber 21 is now in operative position with the fourth work station associated with opening 11. The aforementioned roughing pump associated with fitting 13 and opening 11, e.g. pump 110, evacuates the chamber 21 to a reduced intermediate pressure which is between atmospheric pressure and the pressure at the next succeeding station whilst concurrently purging the chamber 21 from any residual gases or solvent that may be present in the chamber 21 as a result of the processes associated with the second and third work stations. Concurrently, chambers 22–24 are in operative positions with the third, second and first work stations, respectively, and are undergoing the particular operations associated thereat as was previously described with respect to chamber 21.

When member 2 is next incrementally rotated, chamber 21 as a result is operatively positioned with the fifth work station, which is associated with opening 9 as aforementioned. The loaded tray T of substrates M is then removed from chamber 21 by automatic extraction means, not shown, which passes the loaded tray T through the aligned opening 10 and 9 and bellows fitting 90 and into the aforementioned vacuumized staging chamber 108 from where it is progressively moved into the channel 107 of vacuum chamber 104 of the electron beam tester 100 for testing and thereafter subsequently removed by another cylinder assembly 20' which has a similar configuration to the one of assembly 20 but which does not require and hence does not have the cleaning and drying work stations and the associated openings 16A–16B and 17A–17B, respectively, of the assembly 20. Thus, in the vacuum to vacuum entry system apparatuses 20 and 20', transfer of the ceramic substrate loaded trays takes place between the vacuumized chamber of the particular apparatus 20 or 20' and the particular vacuumized chamber 108 or 109, as the case might be. Concurrently, chambers 22–25, which are in operative positions with the fourth, third, second and first work stations, respectively, and are undergoing the particular operations associated thereat as was previously described with respect to chamber 21.

After the next incremental rotation of the member 2 takes place, chamber 21, which is now empty, is in operative position with the sixth work station associated with the opening 12. At this station, the aforementioned gas pump, not shown, which is associated with the opening 12, introduces into the chamber 21 a gas, which is preferably air or nitrogen as the case might be, at an intermediate pressure that is between atmospheric pressure and the pressure at the preceding, i.e. fifth, station. Preferably, the pressure of the gas at the sixth station matches and/or is substantially the same as that of the aforementioned reduced pressure associated with the fourth work station. As such, the fourth and sixth work stations act as buffer stages between the fifth station and the atmospheric pressure associated with the other work stations thereby further mitigating leakage in the seal. Concurrently, chambers 22–26 are now in operative positions with the fifth, fourth, third, second and first work stations, respectively, and are undergoing the particular operations associated thereat as was previously described with respect to chamber 21.

Upon the completion of the next incremental rotation of member 2, chambers 21–26 are now concurrently in operative positions with the first, sixth, fifth, fourth, third and second work stations. As a result, chamber 21 is moved away from the sealed off region between channels 7 and 8 and is placed in atmospheric pressure via opening 15. The assembly 20 is now ready for the chamber 21 to be loaded with the next substrate loaded tray to be tested and for the aforedescribed cycle to be repeated. It should be again understood, chambers 22–26 are concurrently undergoing the particular operations at their last mentioned respective operative positions associated thereat as was previously described with respect to chamber 21.

The parameters of one such vacuum-to-vacuum entry system combination gas bearing and seal apparatus using dry nitrogen as the bearing gas and designed in accordance with the principles of the present invention are indicated in Table I as follows:

TABLE I

| Spacing S | 0.00005 | inches |
|---|---|---|
| Pressure-Opening 9 | 0.000001 | Torr |
| Pressure-Openings 11 and 12 | 0.01 | Torr |
| Pressure-Channels 7 and 8 | 0.01 | Torr |
| Pressure-Opening 15 | 760 | Torr |
| Pressure-Holes 40 and 50 | 40.0 | psi |

The bearing members of the design were made of aluminum and had a cylindrical configurations of approximately nine inches diameters; and the bearing surfaces were hard anodized treated and lapped to a surface flatness of 0.00001 inches.

The present invention is thus highly reliable and conducive to processing workpieces at a high throughput rate. However, it should be understood that while the present invention is particularly useful for vacuum to vacuum entry systems for transferring ceramic substrates into and/or out of a vacuum chamber, it may be also used for other type products or workpieces and/or processing systems, e.g. such as workpiece treatment and/or other type testing processing systems, which require the transfer of the product or workpieces between two vacuumized environments as is apparent to those skilled in the art. Also, the workpieces may be loaded into the loading chamber with other type carriers and/or without the use of a carrier. Moreover, the workpieces and/or the workpiece loaded carriers may be loaded directly into and/or out of the main vacuum chamber without the use of one or more staging chambers. Moreover, while the preferred embodiment is symmetrically configured with respect to axis 3, it should be understood that the invention can be modified to include non-symmetrical configurations as long as the region to be sealed by the gas of the bearing does not encompass the axis 3 in accordance with the principles of the present invention. Furthermore, the present invention may be modified to be rotatable in the reverse direction and/or in a bidirectional manner, and/or can be modified to both transfer the workpieces into and out of a vacuumized chamber. Also, it should be understood that other type bearing gasses besides air or nitrogen may be used such as, for example, other inert gasses. Furthermore, it should be understood that the invention can be practiced with one or more loading chambers, and/or with sectors greater or lesser than 180 degrees.

Thus, while the invention has been described with reference to preferred embodiments thereof, it will be understood by those skilled in the art that various changes in form and details may be made without departing from the scope of the invention.

I claim:

1. Vacuum-to-vacuum entry system apparatus comprising:
   at least two first and second vacuumized chambers,
   first member means having a first planar gas bearing surface and a first another surface,
   a first opening extending through said first member means between the two said first surfaces, said first chamber being disposed adjacent said first another surface, and said first opening being in a predetermined sealed communication with the interior of said first chamber,
   second member means having a second planar gas bearing surface in parallel facing relationship with said first gas planar surface, said second member means having a second another surface,
   means for relative rotation between said first and second gas bearing surfaces about a predetermined axis, said axis being normal to said planar first and second gas bearing surfaces,
   a. second opening extending through said second member means between the two said second surfaces, said second chamber being disposed adjacent said second another surface, and said second opening being in a predetermined sealed communication with the interior of said second chamber,
   said first gas bearing surface having a predetermined region therein offset a predetermined radial distance from said axis and not intersected by said axis, said first opening at said first gas bearing surface being disposed within said region,
   gas supply means for providing a gas between said first and second gas bearing surfaces to support axially said first and second member means with a predetermined spacing between said first and second gas bearing surfaces, and
   gas sink means within a predetermined sector of said first gas bearing surface relative to said axis, said region being disposed within said sector, said gas being sinked away from said region by said gas sink means, said gas between said first and second gas bearing surfaces and said gas sink means coacting to provide a seal for said region and for a zone of said spacing, said zone extending through said spacing from said region to the plane of said second planar gas bearing surface,
   said first and second gas bearing surfaces being angularly positionable about said axis by said rotation means to place said first and second openings at said first and second gas bearing surfaces, respectively, in facing alignment with respect to each other and said sealed zone to effect a sealed communication between said vacuumized first and second chambers.

2. Apparatus according to claim 1 wherein said gas sink means comprises:
   at least two gas sink parallel arcuate channels concentric with said axis and disposed within said sector and in said first gas bearing surface, said region being disposed between said two channels.

3. Apparatus according to claim 1 wherein said first member means is stationary and said second member means is incrementably rotatable by said means for relatively rotating.

4. Apparatus according to claim 3 further comprising:
   means for pivoting said first member means about said axis, and
   biasing means for biasing said first member means towards said second member means,
   said pivoting means and said biasing means coacting with said gas between said first and second gas bearing surfaces to compensate for any skew in said parallel facing relationship.

5. Apparatus according to claim 3 wherein each of said first and second gas bearing surfaces is circular and concentrically disposed about said axis.

6. Apparatus according to claim 5 wherein said gas sink means comprises:
   at least two gas sink parallel arcuate channels concentric with said axis and disposed within said sector and in said first gas bearing surface, said region being disposed between said two channels.

7. Apparatus according to claim 6 wherein said gas is nitrogen and said gas maintains said spacing between said first and second gas bearing surfaces at substantially 0.00005 inches, the pressure of said air is substantially 40 psi, said vacuumized first chamber is at a pressure of 0.000001 Torr, and said vacuumized second chamber prior to said facing alignment of said first and second openings and said two gas sink channels are at a pressure of 0.01 Torr.

8. Vacuum-to-vacuum entry system apparatus comprising:
   at least two first and second vacuumized chambers,
   rotary transport means for supporting said second chamber,
   first member means having a first planar gas thrust bearing surface and a first another surface,
   a first opening extending through said first member means between the two said first surfaces, said first chamber being disposed adjacent said first another surface, and said first opening being in a predetermined sealed communication with the interior of said first chamber,
   said rotary transport means having second member means having a second planar gas thrust bearing surface in parallel facing relationship with said first gas planar surface, said second member means having a second another surface,
   said rotary means incrementally rotating said second gas bearing surface about a predetermined axis, said axis being normal to said planar first and second gas bearing surfaces, said first and second gas bearing surfaces being concentrically aligned with said axis,
   a second opening extending through said second member means between the two said second surfaces, said second chamber being disposed adjacent said second another surface, and said second opening being in a predetermined sealed communication with the interior of said second chamber,
   said first gas bearing surface having a predetermined region therein offset a predetermined radial distance from said axis and not intersected by said axis, said first opening at said first gas bearing surface being disposed within said region,
   gas supply means for providing a gas between said first and second gas bearing surfaces to support axially said first and second member means with a predetermined spacing between said first and second gas bearing surfaces, and
   gas sink means within a predetermined sector of said first gas bearing surface relative to said axis, said region being disposed within said sector, said gas being sinked away from said region by said gas sink means, said gas between said first and second gas bearing surfaces and said gas sink means coacting to provide a seal for said region and for a zone of said spacing, said zone extending through said spacing from said region to the plane of said second planar gas bearing surface,
   said first and second gas bearing surfaces being angularly positionable about said axis by said rotary means to place said first and second openings at said first and second gas bearing surfaces, respectively, in facing alignment with respect to each other and said sealed zone to effect a sealed communication between said vacuumized first and second chambers.

9. Apparatus according to claim 8 wherein said gas sink means comprises:
   at least two gas sink parallel arcuate channels concentric with said axis and disposed within said sector and in said first gas bearing surface, said region being disposed between said two channels.

10. Apparatus according to claim 8 further comprising:
    means for pivoting said first member means about said axis, and
    biasing means for biasing said first member means toward said second member means,
    said pivoting means and said biasing means coacting with said gas between said first and second gas bearing surfaces to compensate for any skew in said parallel facing relationship.

11. Apparatus according to claim 10 wherein said gas sink means comprises:
    at least two gas sink parallel arcuate channels concentric with said axis and disposed within said sector and in said first gas bearing surface, said region being disposed between said two channels.

12. Apparatus according to claim 11 wherein said gas is nitrogen and said gas maintains said spacing between said first and second gas bearing surfaces at substantially 0.00005 inches, the pressure of said air is substantially 40 psi, said vacuumized first chamber is at a pressure of 0.000001 Torr, and said vacuumized second chamber prior to said facing alignment of said first and second openings and said two gas sink channels are at a pressure of 0.01 Torrs.

13. Vacuum-to-vacuum entry system apparatus comprising:
    a first vacuumized chamber and plural second vacuumized chambers,
    rotary transport means for supporting said plural second chambers,
    first disc member means having a first planar gas thrust bearing surfaces and a first opposite planar surface,
    a first opening extending through said first member means between the two said first surfaces, said first chamber being disposed adjacent said first opposite surface, and said first opening being in a predetermined sealed communication with the interior of said first chamber,
    said rotary transport means having second disc member means having a second planar gas thrust bearing surface in parallel facing relationship with said first gas planar surface, said second member means having a second opposite planar surface,
    said rotary means incrementally rotating said second gas bearing surface about a predetermined axis, said axis being normal to said planar first and second surfaces, said first and second surfaces being concentrically aligned with said axis,
    plural second openings, each of said second openings extending through said second member means between the two said second surfaces, each of said second chambers being disposed adjacent said second another surface, and each of said second openings being in a predetermined sealed communication with the interior of a mutually exclusive one of said second chambers,
    said first gas bearing surface having a predetermined region therein offset a predetermined radial distance from said axis and not intersected by said axis, said first opening at said first gas bearing surface being disposed within said region, gas supply means for providing a gas between said first and second gas bearing surfaces to support axially said first and second member means with a predetermined spacing between said first and second gas bearing surfaces, and gas sink means within a predetermined sector of said first gas bearing surface relative to said axis, said region being disposed within said sector, said gas being sinked away from said region by said gas sink means, said gas between said first and second gas bearing surfaces and said gas sink means coacting to provide a seal for said region and for a zone of said spacing, said zone extending through said spacing from said region to the plane of said second planar gas bearing surface, said first and second gas bearing surfaces being angularly positionable about said axis by said rotary means to place said second openings at said second gas bearing surface sequentially in facing alignment with said first opening at said first gas bearing surfaces through said sealed zone to effect a sealed communication between said vacuumized first chamber and said interior of the particular one of said second chambers which is in said predetermined sealed connection with the particular one second openings that is in said alignment with said first opening.

14. Apparatus according to claim 13 wherein said gas sink means comprises:

at least two gas sink parallel arcuate channels concentric with said axis and disposed within said sector and in said first gas bearing surface, said region being disposed between said two channels.

15. Apparatus according to claim 14 further comprising:

means for pivoting said first member means about said axis, and biasing means for biasing said first member means towards said second member means, said pivoting means and said biasing means coacting with said gas between said first and second gas bearing surfaces to compensate for any skew in said parallel facing relationship.

16. Apparatus according to claim 15 wherein said gas sink means comprises:

at least two gas sink parallel arcuate channels concentric with said axis and disposed within said sector and in said first gas bearing surface, said region being disposed between said two channels.

17. Apparatus according to claim 16 wherein said gas is nitrogen and said gas maintains said spacing between said first and second gas bearing surfaces at substantially 0.00005 inches, the pressure of said air is substantially 40 psi, said vacuumized first chamber is at a pressure of 0.000001 Torr, and each of said vacuumized second chambers prior to said facing alignment of said first opening and said particular second opening thereof and said two gas sink channels are at a pressure of 0.01 Torr.

18. Apparatus according to claim 13 wherein each of said second chambers is adapted to carry at least one workpiece, said workpiece being transferred between said first chamber and the particular one of said second chambers carrying the particular said workpiece in a direction parallel to said axis and through said zone whenever said first opening and the particular second opening of the particular second chamber are in said facing alignment.

* * * * *